United States Patent
Yamaguchi et al.

(10) Patent No.: US 12,058,820 B2
(45) Date of Patent: Aug. 6, 2024

(54) CONTROL DEVICE AND MANUFACTURING METHOD OF CONTROL DEVICE

(71) Applicant: YAZAKI CORPORATION, Tokyo (JP)

(72) Inventors: Hayato Yamaguchi, Makinohara (JP); Sadaharu Okuda, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 200 days.

(21) Appl. No.: 17/837,032

(22) Filed: Jun. 10, 2022

(65) Prior Publication Data

US 2022/0400558 A1    Dec. 15, 2022

(30) Foreign Application Priority Data

Jun. 11, 2021  (JP) ................. 2021-098244

(51) Int. Cl.
*H05K 1/18*  (2006.01)
*H05K 3/30*  (2006.01)
*H05K 5/00*  (2006.01)

(52) U.S. Cl.
CPC ........... *H05K 5/0017* (2013.01); *H05K 1/181* (2013.01); *H05K 3/303* (2013.01)

(58) Field of Classification Search
CPC ....... B60R 16/023; B60R 16/03; B60R 16/02; H04L 2012/40215; H04L 12/2856; H04L 12/40; H01R 12/75; H01R 31/06; H02J 2310/46; H02J 7/00; G06F 21/85; H05K 1/181

USPC ........................................................ 361/748
See application file for complete search history.

(56) References Cited

U.S. PATENT DOCUMENTS

| 6,340,848 | B1 | 1/2002 | Maeda |
| 2007/0046004 | A1* | 3/2007 | Komaki ............... B60R 21/017 |
| | | | 307/10.1 |
| 2012/0236525 | A1 | 9/2012 | Okada |
| 2015/0349471 | A1 | 12/2015 | Maki et al. |
| 2019/0074641 | A1 | 3/2019 | Maki et al. |
| 2020/0172033 | A1 | 6/2020 | Iwasaki et al. |
| 2022/0048446 | A1* | 2/2022 | Yasunori .................. H04L 9/40 |
| 2022/0068734 | A1* | 3/2022 | Naruse .................... H01L 25/16 |
| 2022/0101668 | A1* | 3/2022 | Kimura ............... G07C 5/0825 |

(Continued)

FOREIGN PATENT DOCUMENTS

| EP | 3476663 A1 | 5/2019 |
| EP | 3862230 A1 | 8/2021 |

(Continued)

*Primary Examiner* — Mandeep S Buttar (74) *Attorney, Agent, or Firm* — KENEALY VAIDYA LLP (57) ABSTRACT

A control device includes a standard substrate on which a first input/output circuit and a control circuit configured to control the first input/output circuit are mounted, and a power supply substrate on which a connection portion and a power supply circuit are mounted. The first input/output circuit is at least one of an input circuit or an output circuit for a standard electrical equipment. The connection portion is configured to be connected to a power supply line for supplying electric power. The power supply circuit is configured to generate electric power for operating the standard substrate from the electric power supplied from the power supply line.

4 Claims, 4 Drawing Sheets

(56) References Cited

U.S. PATENT DOCUMENTS

2022/0122954 A1*  4/2022  Naruse .................... H01L 23/50
2022/0227318 A1   7/2022  Kurokawa et al.
2023/0420351 A1* 12/2023  Agrawal ................. H01L 23/13

FOREIGN PATENT DOCUMENTS

| EP | 3950435 A1 | 2/2022 |
| JP | H09-259068 A | 10/1997 |
| JP | 2011-76972 A | 4/2011 |
| JP | 2016-15809 A | 1/2016 |
| JP | 2016-203730 A | 12/2016 |
| WO | 2020/121389 A1 | 6/2020 |
| WO | 2020/250530 A1 | 12/2020 |

\* cited by examiner

CONTROL DEVICE AND MANUFACTURING METHOD OF CONTROL DEVICE

CROSS-REFERENCE TO RELATED APPLICATIONS

This application is based on and claims priority under 35 USC 119 from Japanese Patent Application No. 2021-098244 filed on Jun. 11, 2021, the contents of which are incorporated herein by reference.

TECHNICAL FIELD

The present disclosure relates to a control device and a manufacturing method of a control device.

BACKGROUND ART

In recent years, it has been studied that a zone ECU controls an electrical equipment in an area in accordance with an instruction from a central ECU by communication between the central ECU and the zone ECU arranged in each area of a vehicle.

The vehicle has various specifications. For example, only standard electrical equipment is mounted on a vehicle of a low grade specification. In a vehicle of a high grade specification, an extension electrical equipment is mounted in addition to the standard electrical equipment. For this reason, in a communication system of the related art, it is necessary to design and prepare the zone ECU for each specification of the vehicle, and there is a problem in terms of cost.

Therefore, it is conceivable to apply techniques of JP-A-2016-15809 and JP-A-2011-76972 to the zone ECU. JP-A-2016-15809 discloses that a junction box having a standard control circuit for controlling a standard electrical equipment and an extension control circuit for controlling an extension electrical equipment is provided with a standard connector portion for connecting one end of a standard harness connected to the standard electrical equipment and an extension connector portion for connecting one end of an extension harness connected to the extension electrical equipment. In the technique of JP-A-2016-15809, the standard harness is made common regardless of specifications, thereby achieving cost reduction.

In JP-A-2011-76972, it is also considered that a sub-harness is connected to an electronic control unit for a low-grade vehicle, and the sub-harness is connected to a connector with a built-in function capable of multiplex communication. In the technique of JP-A-2011-76972, a base harness that connects the electronic control unit and a standard electrical equipment is made common regardless of specifications, thereby achieving cost reduction.

In recent years, in order to cope with connected, autonomous, shared/services, and electric (CASE) and mobility as a service (Maas), the types of batteries mounted on a vehicle have increased with an increase in the types of electrical equipments mounted on the vehicle. As an example, there are vehicles in which both a battery of 48V and a battery of 12V are mounted, and there are vehicles in which only the battery of 12V is mounted. Therefore, there are various types of power supply circuits provided in the zone ECU depending on specifications, and there is a problem in that cost reduction cannot be sufficiently achieved only by making the harness common.

SUMMARY OF INVENTION

The present disclosure has been made in view of the above circumstances, and an aspect of non-limiting embodiments of the present disclosure relates to provide a control device and a manufacturing method of a control device that can make a substrate common and achieve cost reduction.

In order to achieve the above object, a control device and a manufacturing method of a control device according to the present disclosure are characterized as follows.

According to an aspect of the present disclosure, there is provided a control device for controlling an electrical equipment, the control device including:

a standard substrate on which a first input/output circuit and a control circuit configured to control the first input/output circuit are mounted, the first input/output circuit being at least one of an input circuit or an output circuit for a standard electrical equipment; and a power supply substrate on which a connection portion and a power supply circuit are mounted, in which the connection portion is configured to be connected to a power supply line for supplying electric power, and in which the power supply circuit is configured to generate electric power for operating the standard substrate from the electric power supplied from the power supply line.

Also, according to an aspect of the present disclosure, there is provided a manufacturing method of a control device for controlling an electrical equipment, the manufacturing method including:

providing a standard substrate on which a first input/output circuit and a control circuit configured to control the first input/output circuit are mounted, the first input/output circuit being at least one of an input circuit or an output circuit for a standard electrical equipment;

providing a power supply substrate on which a connection portion and a power supply circuit are mounted; in which the connection portion is configured to be connected to a power supply line for supplying electric power and the power supply circuit is configured to generate electric power for operating the standard substrate from the electric power supplied from the power supply line, providing a plurality of types of the power supply substrates having different power supply circuits; and selecting one of the plurality of types of power supply substrates in accordance with the standard electrical equipment and an electric power supplied from the power supply line, and connecting the selected power supply substrate to the standard substrate.

DESCRIPTION OF EMBODIMENTS

Specific embodiments of the present disclosure will be described below with reference to the drawings.

Figure 1:
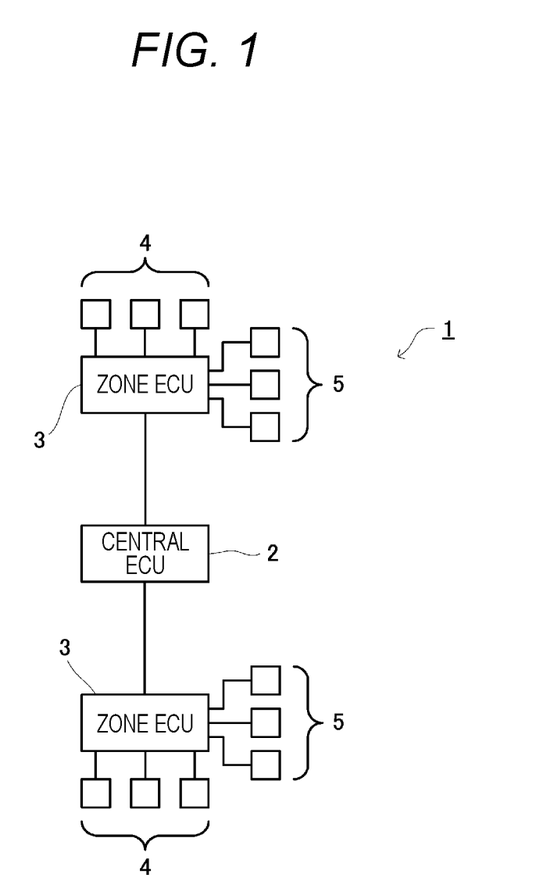
FIG. 1 is a block diagram showing a communication system in which a zone ECU as a control device of the present disclosure is incorporated.

FIG. 1 is a block diagram showing a communication system 1 in which zone ECUs 3 as a control device of the present disclosure are incorporated. The communication system 1 of the present embodiment is mounted on a vehicle.

The communication system 1 includes a central ECU (host control device) 2 and the zone ECUs (control device) 3.

The central ECU 2 is configured by a microcomputer having a CPU, and is provided in, for example, an instrument panel of the vehicle. The central ECU 2 controls the entire communication system 1.

The zone ECU 3 is provided in each area of the vehicle such as left and right doors. The zone ECU 3 communicates with the central ECU 2, and controls a standard electrical equipment 4 and an extension electrical equipment 5 arranged in areas in accordance with an instruction from the central ECU 2. The standard electrical equipment 4 is an electrical equipment (for example, an air conditioner unit, a power window unit, or the like) that is used in common to be attached to a high-grade vehicle and a low-grade vehicle. The standard electrical equipment 4 may be different depending on specifications of a vehicle to be attached. The extension electrical equipment 5 is an electrical equipment that is selectively attached in accordance with the specifications of the vehicle to be attached. The extension electrical equipment 5 may be attached at the time of shipment of the vehicle, or may be attached after the shipment.

Figure 2:
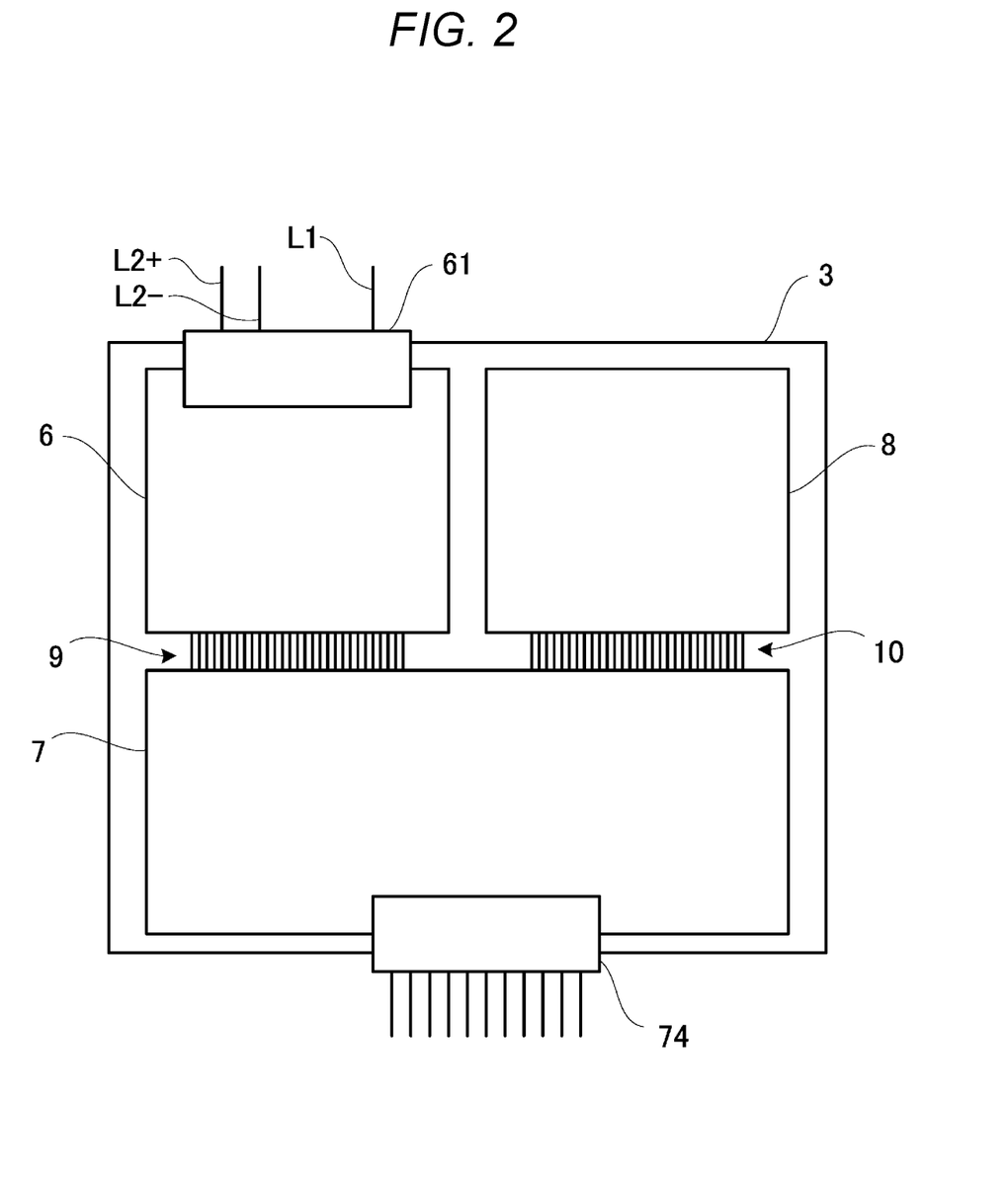
FIG. 2 is a configuration diagram showing the zone ECU shown in FIG. 1 for a high-grade vehicle.
Figure 3:
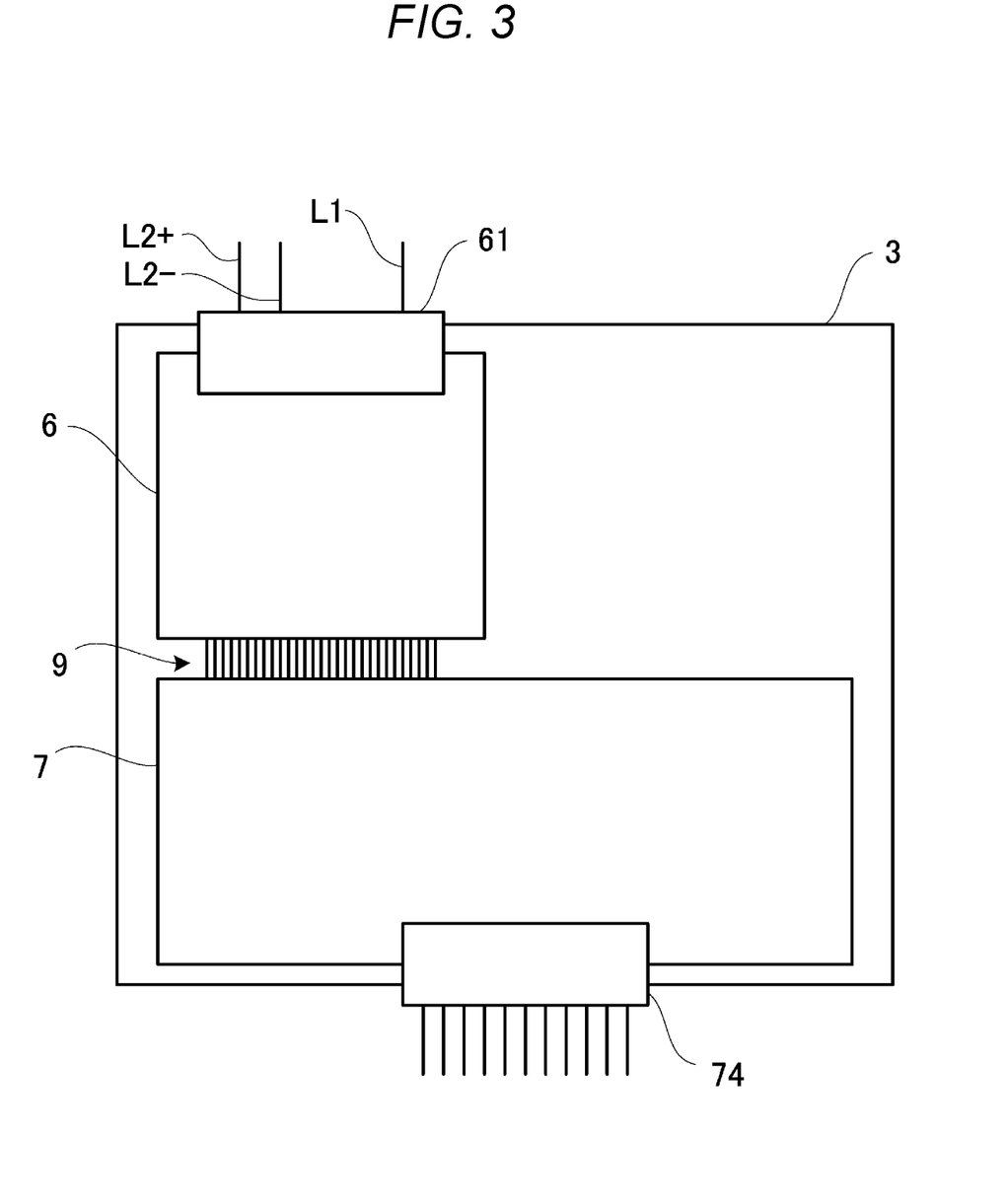
FIG. 3 is a configuration diagram showing the zone ECU shown in FIG. 1 for a low-grade vehicle.

Next, a configuration of the zone ECU 3 will be described with reference to FIGS. 2 and 3. FIG. 2 shows the zone ECU 3 for a high-grade vehicle in which the extension electrical equipment 5 is mounted. FIG. 3 shows the zone ECU 3 for a low-grade vehicle in which the extension electrical equipment 5 is not mounted. As shown in FIG. 2, the zone ECU 3 for a high-grade vehicle includes a trunk line substrate 6 (power supply substrate), a base substrate 7 (standard substrate) for operating the standard electrical equipment 4, an extension substrate 8 for operating the extension electrical equipment 5, a connection portion 9 for connecting the trunk line substrate 6 and the base substrate 7, and connection portions 10 for connecting the base substrate 7 and the extension substrate 8. The trunk line substrate 6, the base substrate 7, and the extension substrate 8 described above are formed of separate substrates. As shown in FIG. 3, the zone ECU 3 for a low-grade vehicle includes the trunk line substrate 6 and the base substrate 7, and does not include the extension substrate 8.

Figure 4:
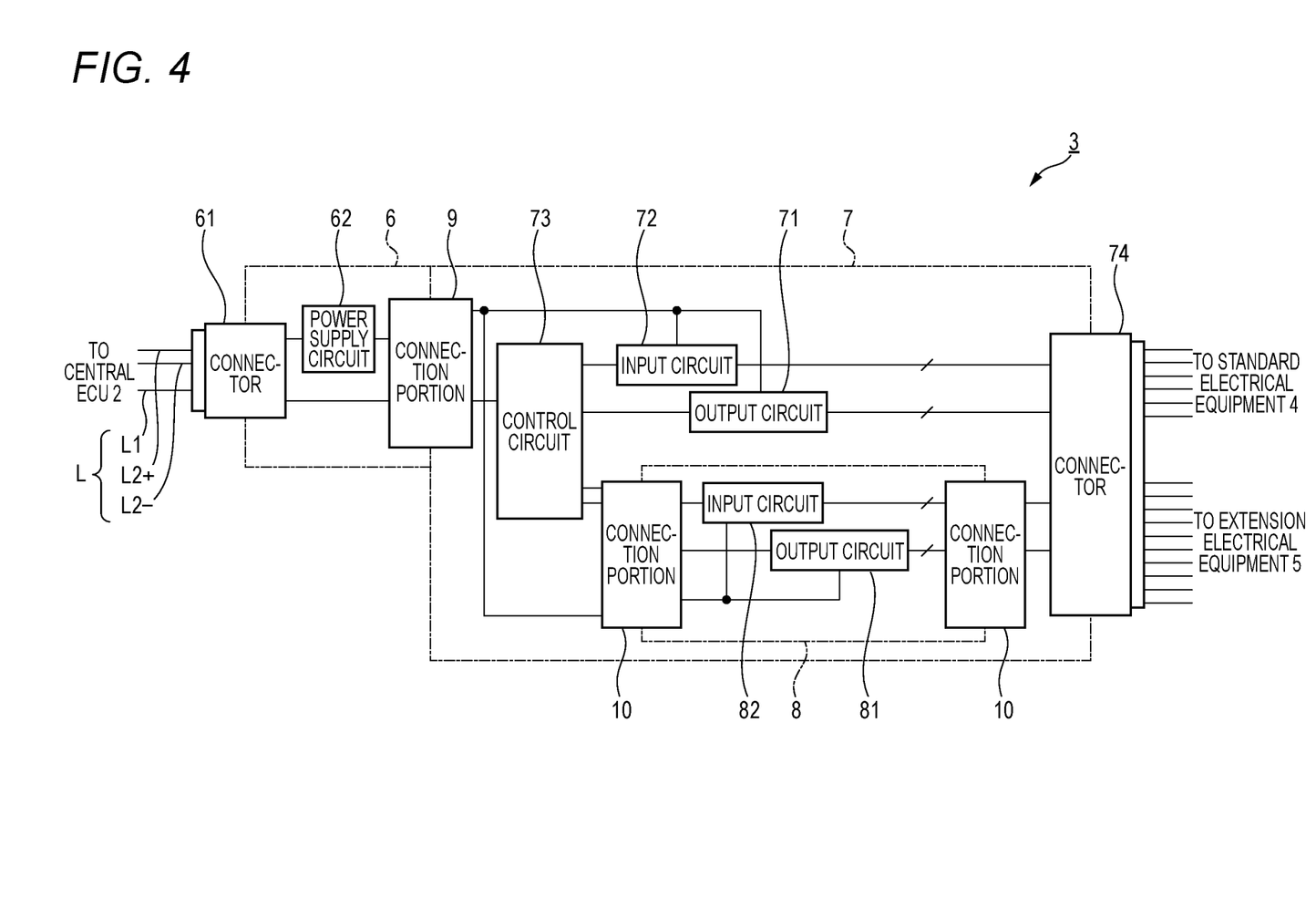
FIG. 4 is a detailed configuration diagram of the zone ECU shown in FIG. 2.

First, the trunk line substrate 6 will be described. As shown in FIG. 4, a connector 61 (connection portion) for connecting to a trunk line L connected to the central ECU 2 and a power supply circuit 62 are mounted on the trunk line substrate 6. The trunk line L is connected between the central ECU 2 and the zone ECU 3. The trunk line L includes a communication line L1 for communicating with the central ECU 2, and a positive electrode line L2+ and a negative electrode line L2− (power supply line) for supplying electric power. A positive electrode potential of the power supply is supplied from the positive electrode line L2+, and a negative electrode potential (ground) of the power supply is supplied from the negative electrode line L2−.

The power supply circuit 62 is a circuit that generates electric power for operating the base substrate 7 and the extension substrate 8, which will be described later, from the electric power supplied from the positive electrode lines L2+ and L2−. Depending on the specifications of the vehicle, a battery of 48V may be mounted on the vehicle and a voltage of 48V may be supplied from the positive electrode line L2+ and the negative electrode line L2−, or a battery of 12V may be mounted on the vehicle and a voltage of 12V may be supplied from the positive electrode line L2+ and the negative electrode line L2−. In addition, the electrical equipments 4, 5 may have a required voltage of 48V or 12V. In the trunk line substrate 6 of the present embodiment, a plurality of types of substrates having different power supply circuits 62 are prepared in accordance with the specifications of such a vehicle. Hereinafter, in the present embodiment, a case where two different types of power supply circuits 62 are prepared as the trunk line substrate 6 will be described, but three or more types of trunk line substrates 6 may be prepared.

In the present embodiment, as the power supply circuit 62, two types are prepared, that is, a power supply circuit constituted only by a constant voltage circuit and a power supply circuit constituted by a constant voltage circuit and a DC/DC converter. The constant voltage circuit is a known constant voltage circuit including, for example, a Zener diode, and can generate a voltage of 5V to be supplied to a control circuit 73 to be described later from the voltages supplied from the positive electrode line L2+ and the negative electrode line L2−. The DC/DC converter steps down a voltage of 48V supplied from the positive electrode line L2+ and the negative electrode line L2− to a voltage of 12V.

In a case where the battery of 48V is mounted and the required voltages of the electrical equipments 4, 5 connected to the zone ECU 3 are 12V, the trunk line substrate 6 having the power supply circuit 62 provided with the constant voltage circuit and the DC/DC converter is selected and connected to the base substrate 7 to be described later. On the other hand, in a case where the required voltages of the electrical equipments 4, 5 connected to the zone ECU 3 are the same as the power supply voltage supplied from the positive electrode line L2+ and the negative electrode line L2−, the trunk line substrate 6 provided with only the constant voltage circuit is selected and connected to the base substrate 7 to be described later.

Next, the base substrate 7 will be described. The base substrate 7 is mounted with an output circuit 71 and an input circuit 72 (first input/output circuit) for the standard electrical equipment 4, the control circuit 73 for controlling the output circuit 71 and the input circuit 72 in accordance with communication with the central ECU 2, and a connector 74 for connecting to the standard electrical equipment 4 and the extension electrical equipment 5. The output circuit 71 is provided for the standard electrical equipment 4 that operates by an output from the control circuit 73, such as a motor and a lamp. The output circuit 71 is supplied with any one of the electric power supplied from the positive electrode line L2+ and the negative electrode line L2− and the electric power generated by the DC/DC converter provided in the power supply circuit 62, and the output circuit 71 supplies the supplied electric power to the standard electrical equipment 4 under the control of the control circuit 73.

The input circuit 72 is provided for the standard electrical equipment 4, such as a detection switch, that inputs ON/OFF information or the like to the control circuit 73, generates the ON/OFF information or the like from the power supply supplied from the trunk line substrate 6, and inputs the information to the control circuit 73. In the example shown in FIG. 4, the base substrate 7 is mounted with both the output circuit 71 and the input circuit 72, but may be mounted with at least one of the output circuit 71 and the input circuit 72 depending on the standard electrical equipment 4 connected to the zone ECU 3.

The control circuit 73 is configured by a microcomputer having a CPU, is connected to the communication line L1 via the trunk line substrate 6, and is provided so as to be able to communicate with the central ECU 2. In addition, the control circuit 73 is supplied with electric power of 5V generated by the power supply circuit 62, and is operated by the electric power of 5V.

The connector 74 is connected to a terminal of an electric wire drawn out from the standard electrical equipment 4. The output circuit 71 and the input circuit 72 of the base substrate 7 and the standard electrical equipment 4 are connected to each other via the connector 74.

A plurality of types of base substrates 7 of the present embodiment are prepared in accordance with the specifications of the vehicle. For example, a plurality of types such as a base substrate 7 on which only the output circuit 71 is mounted, a base substrate 7 on which only the input circuit 72 is mounted, and a base substrate 7 on which a communication circuit for communicating with the standard electrical equipment 4 is mounted in addition to the output circuit 71 and the input circuit 72 are considered.

Next, the extension substrate 8 will be described. An output circuit 81 and an input circuit 82 (second input/output circuit) for the extension electrical equipment 5 are mounted on the extension substrate 8. Similarly to the output circuit 71, the output circuit 81 is provided for the extension electrical equipment 5 that operates by an output from the control circuit 73, such as a motor or a lamp. The output circuit 81 is supplied with any one of the electric power supplied from the positive electrode line L2+ and the negative electrode line L2− and the electric power generated by the DC/DC converter provided in the power supply circuit 62 via the base substrate 7, and the output circuit 81 supplies the supplied electric power to the extension electrical equipment 5 under the control of the control circuit 73.

Similarly to the input circuit 72, the input circuit 82 is provided for the extension electrical equipment 5, such as a detection switch, that inputs ON/OFF information or the like to the control circuit 73, generates the ON/OFF information or the like from the power supply supplied from the trunk line substrate 6, and inputs the information to the control circuit 73. In the example shown in FIG. 4, the extension substrate 8 is mounted with both the output circuit 81 and the input circuit 82, but may be mounted with at least one of the output circuit 81 and the input circuit 82 depending on the extension electrical equipment 5 connected to the zone ECU 3.

The output circuit 81 and the input circuit 82 described above are connected to the extension electrical equipment 5 via the connector 74 mounted on the base substrate 7 and the connection portion 10, which will be described later.

A plurality of types of extension substrates 8 of the present embodiment are prepared in accordance with the specifications of the vehicle. For example, a plurality of types such as an extension substrate 8 on which only the output circuit 81 is mounted, an extension substrate 8 on which only the input circuit 82 is mounted, and an extension substrate 8 on which a communication circuit for communicating with the extension electrical equipment 5 is mounted in addition to the output circuit 81 and the input circuit 82 are considered.

The connection portion 9 connects the trunk line substrate 6 and the base substrate 7. The connection portions 10 connect the base substrate 7 and the extension substrate 8. As the connection portions 9, 10, a pin header or a connector may be used.

Next, a method of assembling the zone ECU 3 described above will be described. As described above, a plurality of types of trunk line substrates 6, base substrates 7, and extension substrates 8 are prepared. First, a case where only the standard electrical equipment 4 is connected to the zone ECU 3 will be described. One of the plurality of types of trunk line substrates 6 is selected according to the required voltage of the standard electrical equipment 4 and the power supply voltage supplied by the positive electrode line L2+ and the negative electrode line L2−. Further, one of the plurality of base substrates 7 is selected according to the standard electrical equipment 4 connected to the zone ECU 3. Then, the selected trunk line substrate 6 and base substrate 7 are connected to complete the zone ECU 3.

Next, a case where the standard electrical equipment 4 and the extension electrical equipment 5 are connected to the zone ECU 3 will be described. One of the two types of trunk line substrates 6 is selected according to the required voltage of the standard electrical equipment 4 and the power supply voltage supplied by the positive electrode line L2+ and the negative electrode line L2−. Further, one of the plurality of base substrates 7 is selected according to the standard electrical equipment 4 connected to the zone ECU 3. Further, one of the plurality of extension substrates 8 is selected according to the extension electrical equipment 5 connected to the zone ECU 3. Then, the selected trunk line substrate 6, base substrate 7, and extension substrate 8 are connected to complete the zone ECU 3.

According to the above-described embodiment, it is possible to select and connect the trunk line substrate 6, the base substrate 7, and the extension substrate 8 according to the specifications of the vehicle. As a result, the trunk line substrate 6, the base substrate 7, and the extension substrate 8 can be used in common in a plurality of specifications, and therefore cost reduction can be achieved.

A specific example will be described. Now, in a case where two types of trunk line substrates 6A, 6B are prepared, two types of base substrates 7A, 7B are prepared, and two types of extension substrates 8A, 8B are prepared, the zone ECU 3 according to the maximum specifications S1 to S12 can be configured by the substrates 6 to 8 as described below.

Specification S1: trunk line substrate 6A+ base substrate 7A

Specification S2: trunk line substrate 6A+ base substrate 7B

Specification S3: trunk line substrate 6B+ base substrate 7A

Specification S4: trunk line substrate 6B+ base substrate 7B

Specifications S5 to S8: trunk line substrate 6+ base substrate 7 of Specifications S1 to S4+ extension substrate 8A

Specifications S9 to S12: trunk line substrate 6+ base substrate 7 of Specifications S1 to S4+ extension substrate 8B

In this case, the trunk line substrate 6A can be used in common in the specifications S1, S2, and the like, and the trunk line substrate 6B can be used in common in the specifications S3, S4, and the like. The base substrate 7A can be used in common in the specifications S1, S3, and the like, and the base substrate 7B can be used in common in the specifications S2, S4, and the like. In addition, the extension substrate 8A can be used in common in the specifications S5 to S8, and the extension substrate 8B can be used in common in the specifications S9 to S12.

In this way, by making the substrates 6 to 8 common in the plurality of specifications, it is possible to reduce the cost of the zone ECU 3 due to the mass volume. The number of components (including the substrates 6 to 8) constituting the zone ECU 3 can be reduced, and management cost can be reduced. In addition, there is a case where a change in the circuit of the zone ECU 3 can be handled only by selecting the substrates 6 to 8, and the number of development man-hours can be reduced.

The present disclosure is not limited to the embodiment described above, and modifications, improvements, and the like can be made as appropriate. In addition, materials, shapes, dimensions, numbers, arrangement positions, and the like of the respective constituent elements in the embodiment described above are freely set and are not limited as long as the present disclosure can be achieved.

According to the embodiment described above, a plurality of types of base substrate 7 and extension substrates 8 are prepared, but the present disclosure is not limited thereto. Only one type of base substrate 7 and extension substrate 8 may be prepared.

According to the embodiment described above, the control circuit 73 controls the electrical equipments 4, 5 in accordance with the communication with the central ECU 2, but the present disclosure is not limited thereto. The present disclosure can also be applied to a system in which the control circuit 73 independently controls the electrical equipments 4, 5.

According to the embodiment described above, the extension electrical equipment 5 is connected to the connector 74 mounted on the base substrate 7, but the present disclosure is not limited thereto. The extension electrical equipment 5 may be connected to a connector mounted on the extension substrate 8.

Here, characteristics of the embodiments of the control device and a manufacturing method of a control device according to the present disclosure described above will be briefly summarized and listed in [1] to [4] below.

[1] A control device (3) for controlling an electrical equipment (4, 5), the control device (3) including:
  a standard substrate (7) on which a first input/output circuit (71, 72) and a control circuit (73) configured to control the first input/output circuit (71, 72) are mounted, first input/output circuit (71, 72) being at least one of an input circuit (72) or an output circuit (71) for a standard electrical equipment (4); and
  a power supply substrate (6) on which a connection portion (61) and a power supply circuit (62) are mounted, in which connection portion (61) is configured to be connected to a power supply line (L2+, L2−) for supplying electric power and the power supply circuit (62) is configured to generate electric power for operating the standard substrate (7) from the electric power supplied from the power supply line (L2+, L2−).

[2] The control device (3) according to [1],
  in which a communication line (L1) with a host control device (2) is connected to the connection portion (61), and
  in which the control circuit (73) is connected to the host control device (2) via the power supply substrate (6) so as to be able to communicate with each other, and controls the first input/output circuit (71, 72) in accordance with communication with the host control device (2).

[3] The control device (3) according to [1] or [2], further including:
  an extension substrate (8) on which a second input/output circuit (81, 82) is mounted,
  in which the second input/output circuit (81, 82) is at least one of an input circuit (82) or an output circuit (81) for an extension electrical equipment (5),
  in which the control circuit (73) controls the second input/output circuit (81, 82), and
  in which the extension substrate (8) is supplied with the electric power from the power supply circuit (62) via the standard substrate (7).

[4] A manufacturing method of a control device (3) for controlling an electrical equipment (4, 5), the manufacturing method including:
  providing a standard substrate (7) on which a first input/output circuit (71, 72) and a control circuit (73) configured to control the first input/output circuit (71, 72) are mounted, the first input/output circuit (71, 72) being at least one of an input circuit (72) or an output circuit (71) for a standard electrical equipment (4);
  providing a power supply substrate (6) on which a connection portion (61) and a power supply circuit (62) are mounted; in which the connection portion (61) is configured to be connected to a power supply line (L2+, L2−) for supplying electric power and the power supply circuit (62) is configured to generate electric power for operating the standard substrate (7) from the electric power supplied from the power supply line (L2+, L2−),
  providing a plurality of types of the power supply substrates (6) having different power supply circuits (62); and
  selecting one of the plurality of types of power supply substrates (6) in accordance with the standard electrical equipment (4) and an electric power supplied from the power supply line (L2+, L2−), and connecting the selected power supply substrate (6) to the standard substrate (7).

According to the control device having the above configuration of [1], it is possible to select and connect the power supply substrate and the standard substrate according to the specifications of the vehicle. As a result, since the power supply substrate or the standard substrate can be used in common in a plurality of specifications, the cost can be reduced.

According to the control device having the above configuration of [2], the control circuit can control the standard electrical equipment by communication with the host control device.

According to the control device having the above configuration of [3], it is possible to select and connect the extension substrate according to the specifications of the vehicle. As a result, the power supply substrate, the standard substrate, or the extension substrate can be used in common in a plurality of specifications, so that the cost can be reduced.

According to the manufacturing method of a control device having the above configuration of [4], the power supply substrate according to the specifications of the vehicle can be connected to the standard substrate. As a result, since the power supply substrate or the standard substrate can be used in common in a plurality of specifications, the cost can be reduced.

According to the present disclosure, it is possible to provide the control device and the manufacturing method of a control device that can make the substrate common in a plurality of specifications and achieve cost reduction.

The present disclosure has been briefly described above. Further, details of the present disclosure will be clarified by reading a mode (hereinafter, referred to as an "embodiment") for carrying out the disclosure to be described below with reference to the accompanying drawings.

What is claimed is:

1. A kit for manufacturing a control device for controlling an electrical equipment, the kit comprising:
  a standard substrate on which a first input/output circuit and a control circuit configured to control the first input/output circuit are mounted, the first input/output circuit being at least one of an input circuit or an output circuit for a standard electrical equipment; and a first power supply substrate on which a first connection portion and a first power supply circuit are mounted;

a second power supply substrate on which a second connection portion and a second power supply circuit are mounted, wherein the each of the first connection portion and the second connection portion is configured to be connected to a power supply line for supplying electric power, wherein the each of the first power supply circuit and the second power supply circuit is configured to generate electric power for operating the standard substrate from the electric power supplied from the power supply line, and wherein each of the first power supply substrate and the second power supply substrate is configured to be connected to the standard substrate.

2. The kit for manufacturing the control device according to claim 1, wherein the connection portion is configured to be connected to a communication with a host control device, and wherein the control circuit is configured to be connected to the host control device via one of the first power supply substrate and the second power supply substrate so as to be able to communicate with each other, and control the first input/output circuit in accordance with communication with the host control device.

3. The kit for manufacturing the control device according to claim 1, further comprising:

an extension substrate on which a second input/output circuit is mounted, wherein the second input/output circuit is at least one of an input circuit or an output circuit for an extension electrical equipment, wherein the control circuit is configured to control the second input/output circuit, and wherein the extension substrate is configured to be supplied with the electric power from the one of the power supply circuit via the standard substrate.

4. A manufacturing method of a control device for controlling an electrical equipment, the manufacturing method comprising:

providing a standard substrate on which a first input/output circuit and a control circuit configured to control the first input/output circuit are mounted, the first input/output circuit being at least one of an input circuit or an output circuit for a standard electrical equipment;

providing a plurality of power supply substrates, a connection portion and a power supply circuit are mounted on each of the power supply substrates; wherein each of the connection portions is configured to be connected to a power supply line for supplying electric power and each of the power supply circuits is configured to generate electric power for operating the standard substrate from the electric power supplied from the power supply line, the power supply circuits are different from each other; and selecting one of the plurality of power supply substrates in accordance with the standard electrical equipment and an electric power supplied from the power supply line, and connecting the one of the power supply substrates to the standard substrate.

* * * * *